US008912810B2

(12) United States Patent
Hsu et al.

(10) Patent No.: US 8,912,810 B2
(45) Date of Patent: Dec. 16, 2014

(54) CONTACTOR WITH MULTI-PIN DEVICE CONTACTS

(75) Inventors: Stanley Hsu, Taipei (TW); Chi-Tsung Lee, Taipei (TW); Byron Harry Gibbs, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 402 days.

(21) Appl. No.: 13/228,579

(22) Filed: Sep. 9, 2011

(65) Prior Publication Data

US 2013/0063172 A1 Mar. 14, 2013

(51) Int. Cl.
*G01R 31/20* (2006.01)
*G01R 1/073* (2006.01)

(52) U.S. Cl.
CPC ........ *G01R 1/07314* (2013.01); *G01R 31/3889* (2013.01)
USPC .................................... 324/754.09

(58) Field of Classification Search
USPC .................................... 324/754.09
See application file for complete search history.

(56) References Cited

U.S. PATENT DOCUMENTS

| | | | | |
|---|---|---|---|---|
| 3,806,801 A | * | 4/1974 | Bove | 324/72.5 |
| 5,734,270 A | * | 3/1998 | Buchanan | 324/754.07 |
| 5,805,426 A | * | 9/1998 | Merritt et al. | 361/769 |
| 5,933,309 A | * | 8/1999 | Smith | 361/88 |
| 6,249,114 B1 | * | 6/2001 | Sakai | 324/72.5 |
| 7,772,830 B2 | | 8/2010 | Hsu et al. | |
| 8,441,275 B1 | * | 5/2013 | Alladio | 324/756.02 |
| 2002/0003429 A1 | * | 1/2002 | Wiggin et al. | 324/761 |
| 2005/0189956 A1 | * | 9/2005 | Eldridge et al. | 324/754 |
| 2007/0090849 A1 | | 4/2007 | Mayder | |
| 2008/0252322 A1 | * | 10/2008 | Hopkins et al. | 324/758 |
| 2009/0153169 A1 | * | 6/2009 | Soubh et al. | 324/758 |
| 2010/0264935 A1 | | 10/2010 | Erdman et al. | |
| 2011/0285416 A1 | * | 11/2011 | Petersen | 324/755.01 |

* cited by examiner

*Primary Examiner* — Patrick Assouad
*Assistant Examiner* — Demetrius Pretlow
(74) *Attorney, Agent, or Firm* — Steven A. Shaw; Frederick J. Telecky, Jr.

(57) ABSTRACT

A contactor assembly for automated testing a device under test (DUT) that includes a plurality of separate electrodes including a first electrode includes a tester load board and a contactor body coupled to the tester load board. A plurality of contactor pins carried by the contactor body includes a first contactor pin and a second contactor pin that are electrically coupled to the tester load board. The tester load board is configured to couple the plurality of contactor pins to automatic test equipment (ATE) for testing the DUT. The first contactor pin and second contactor pin are positioned to both contact the first electrode. A first path to the first contactor pin and a second path to the second contactor pin are electrically shorted together by the contactor assembly to be electrically in parallel to provide redundant paths to the first electrode during automated testing of the DUT.

6 Claims, 4 Drawing Sheets

CONTACTOR WITH MULTI-PIN DEVICE CONTACTS

FIELD

Disclosed embodiments relate to electrical testing of semiconductor integrated circuit (IC) devices.

BACKGROUND

Semiconductor devices such as ball grid array (e.g., BGA) packaged ICs are subject to a testing process prior to their final completion or incorporation into electronic apparatus. The testing process includes but is not limited to, testing of singulated or electrically isolated devices either bare die, packaged IC (temporary or permanent), or variants in between. Commonly, electrical testing is accomplished using automatic test equipment (ATE) configured for electrically stimulating semiconductor devices and then examining their output responses for proper functioning. In general, contactor pins associated with the ATE are placed in physical and electrical contact with metalized contact surfaces of a device under test (DUT). These surfaces may include test pads, bond pads, solder balls, leads and/or other conductive media. The functioning of DUTs may be tested by invoking stimuli on various inputs and then measuring responses sensed on outputs at the metalized contact surfaces.

Generally, a tester load board formed from a printed circuit board (PCB) or other media provides interface between an ATE and DUTs. The tester load board conventionally includes one or more contactor assembly, sometimes referred to as "test socket(s)" into which DUT(s) is (are) inserted. During automated testing, a DUT, such as a thin-shrink small outline package (TSSOP) for example, is thrust into the socket by a handler and held into position for the duration of testing. While held in the socket, contact surfaces on the DUT, such as leads, in the case of a TSSOP, make contact with the contactor pins. After insertion into the contactor, the DUT is electrically connected to the ATE through the tester load board, its sub-assemblies, and other interfacing apparatus. For the purpose of illustration, a DUT is brought into contact with pogo pins carried by a contactor body and coupled by a tester load board to an ATE. The ATE is generally supplied with software that includes the stimulus and response recipe required to test the proper functioning of a specific DUT.

Typically, a test "lot" includes numerous devices tested serially or in parallel which are subjected to the same testing process. A device handler thrusts DUTs into sockets where they are held in position, tested, removed, and then either rejected or accepted based on the results obtained by the ATE.

This type of testing presents technical challenges in verifying the proper functioning of DUTs while avoiding false readings which result in the erroneous rejection of operable DUTs. One of the challenges encountered in this type of testing is ensuring adequate electrical contact between the contactor's pins and the contact surfaces of the DUT. Poor electrical contact, caused by for example the presents of contaminates (e.g., debris), can result in erroneous test readings. These readings can be indicative of IC failure modes to include continuity, functional, parametric or others common to semiconductor testing. When erroneous readings are encountered, these can lead to the false rejection of otherwise good DUTs resulting in needless yield loss. However, some yield recovery may be possible through retesting. By either accepting the erroneous yield loss or by retesting to achieve recovery, production costs are elevated.

SUMMARY

Disclosed embodiments describe contactor assemblies for the automated testing of a semiconductor device under test (DUT) that reduce the problem of false test readings which result in the invalid rejection of otherwise functional/operable DUTs. Contactor assemblies are disclosed that simultaneously contact at least two different locations on the same DUT contact surface referred to herein as an electrode (e.g., lead, perimeter land, solder bump) which provides at least one redundant contact. Disclosed contactor assemblies have been found to substantially increase the probability that at least one good electrical contact is made to each electrode by the pins of the contactor. Moreover, by ensuring adequate electrical contact between test equipment and DUTs, disclosed embodiments reduce the need to detach the tester load board and/or its subcomponents from the test cell for cleaning or repair, thereby reducing interruptions of the testing process.

Disclosed embodiments include contactor assemblies for automated testing of DUTs that include a plurality of separate electrodes including a first electrode. The contactor assembly includes a tester load board and a contactor body coupled to the tester load board. A plurality of contactor pins carried by the contactor body includes a first contactor pin and a second contactor pin that are electrically coupled to the tester load board. The tester load board is configured to couple the plurality of contactor pins to automatic test equipment (ATE) for testing the DUT. The first contactor pin and second contactor pin are positioned to both contact the first electrode. A first path to the first contactor pin and a second path to the second contactor pin are electrically shorted by the contactor assembly to provide electrically and redundant paths to the first electrode during automated testing of the DUT.

DETAILED DESCRIPTION

Figure 1A:
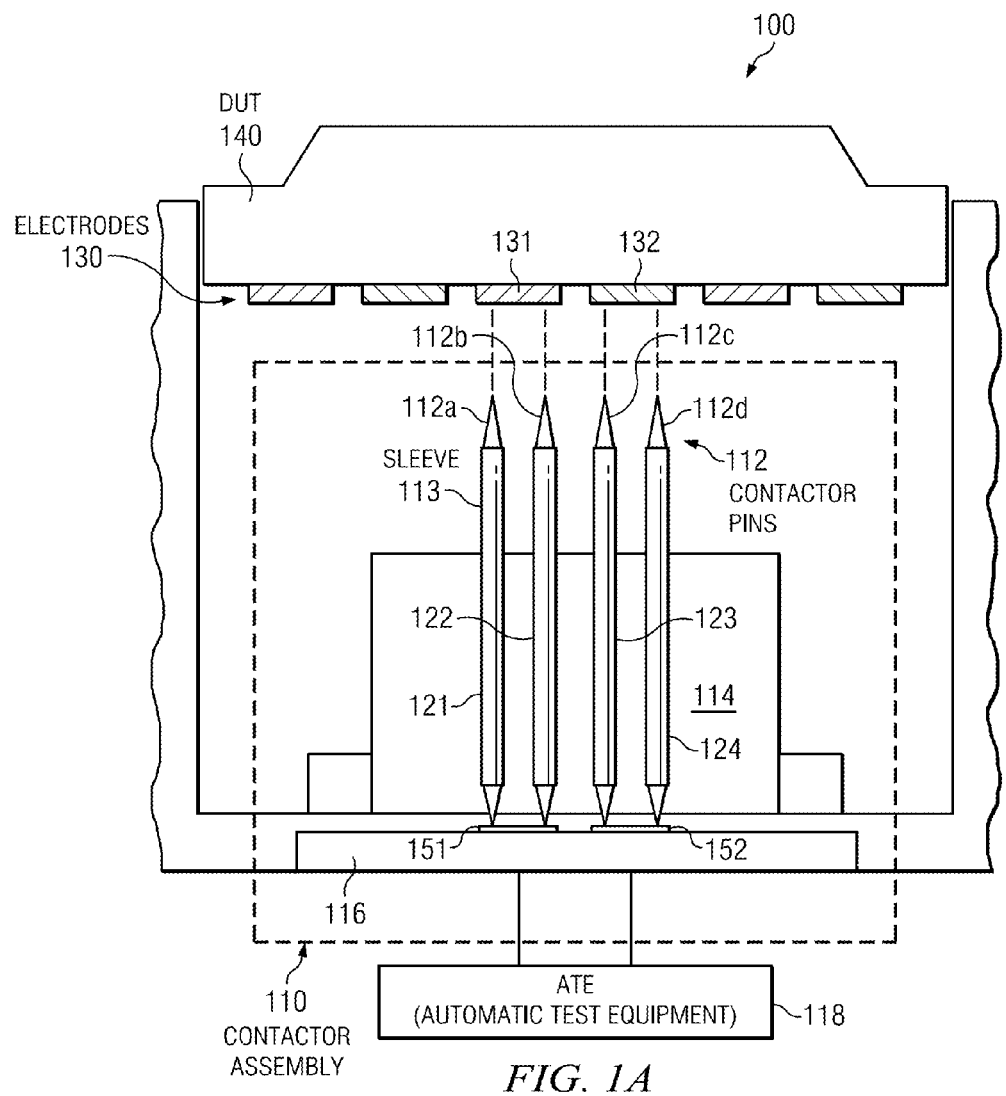
FIG. 1A represents an automatic tester including an example contactor assembly for automated testing of a DUT that includes a plurality of separate electrodes, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a depiction 100 that represents automatic test equipment 118 interfaced to an example contactor assembly 110 ready for automated testing of a DUT 140 that includes a plurality of separate electrodes 130 including a first electrode 131 and second electrode 132, according to a disclosed embodiment. Contactor assembly 110 comprises a tester load board 116, a contactor body 114 coupled to the tester load board 116, and a plurality of contactor pins 112 each within a sleeve 113 carried by the contactor body 114, shown as first contactor pin 112(a), second contactor pin 112(b), third contactor pin 112(c), a fourth contactor pin 112(d) that are electrically coupled to the tester load board 116.

Generally, the tester load board 116 is formed from a printed circuit board (PCB) or other media that provides the interface between the ATE 118 and DUT 140. The tester load board 116 conventionally includes one or more contactor assembly, sometimes referred to as "test socket(s)" into which DUT(s) such as DUT 140 is (are) inserted. Although shown as pogo pins, contactor pins 112 can also comprise fuzz buttons, and the like. The tester load board 116 is configured to couple the plurality of contactor pins 112 to the ATE 118 for testing the DUT 140.

During testing, contactor pins 112 associated with the ATE 118 are placed in physical and electrical contact with electrodes 130 that function as metalized contact surfaces of the DUT 140 that connect to respective nodes on the DUT. Such contact surfaces may include test pads, bond pads, perimeter lands, solder balls, and/or other electrically conductive media. The functioning of DUT 140 may be tested by invoking stimuli on input electrodes 130 and then measuring responses on the electrodes 130.

The first contactor pin 112(a) and second contactor pin 112(b) are positioned to both contact the same first electrode 131, while the third contactor pin 112(c) and fourth contactor pin 112(d) are positioned to both contact the same second electrode 132. In the case the electrodes of the DUT 140 are leads, one contactor pin can contact one portion of the lead and a second (redundant) contactor pin can contact another portion of the same lead as well.

A first path 121 to the first contactor pin 112(a) and a second path 122 to the second contactor pin 112(b) are shown electrically shorted together by the contactor assembly 110 shown in FIG. 1A by pad 151 on tester load board 116, and a third path 123 to the third contactor pin 112(c) and a fourth path 124 to the fourth contactor pin 112(d) are shown electrically shorted together by pad 152 on tester load board 116. The electrical shorting of the contactor pins 112(a)/112(b) and 112(c)/112(d) results in redundant parallel paths to the first electrode 131 and second electrode 132, respectively, during automated testing of the DUT 140. Accordingly, only one of the electrical contact to the electrodes 131 (from 112(a)/112(b)) and 132 (from 112(c)/112(d)) is required to allow accurate testing of the DUT 140. This aspect of disclosed embodiments reduces the probability of false opens.

Figure 1B:
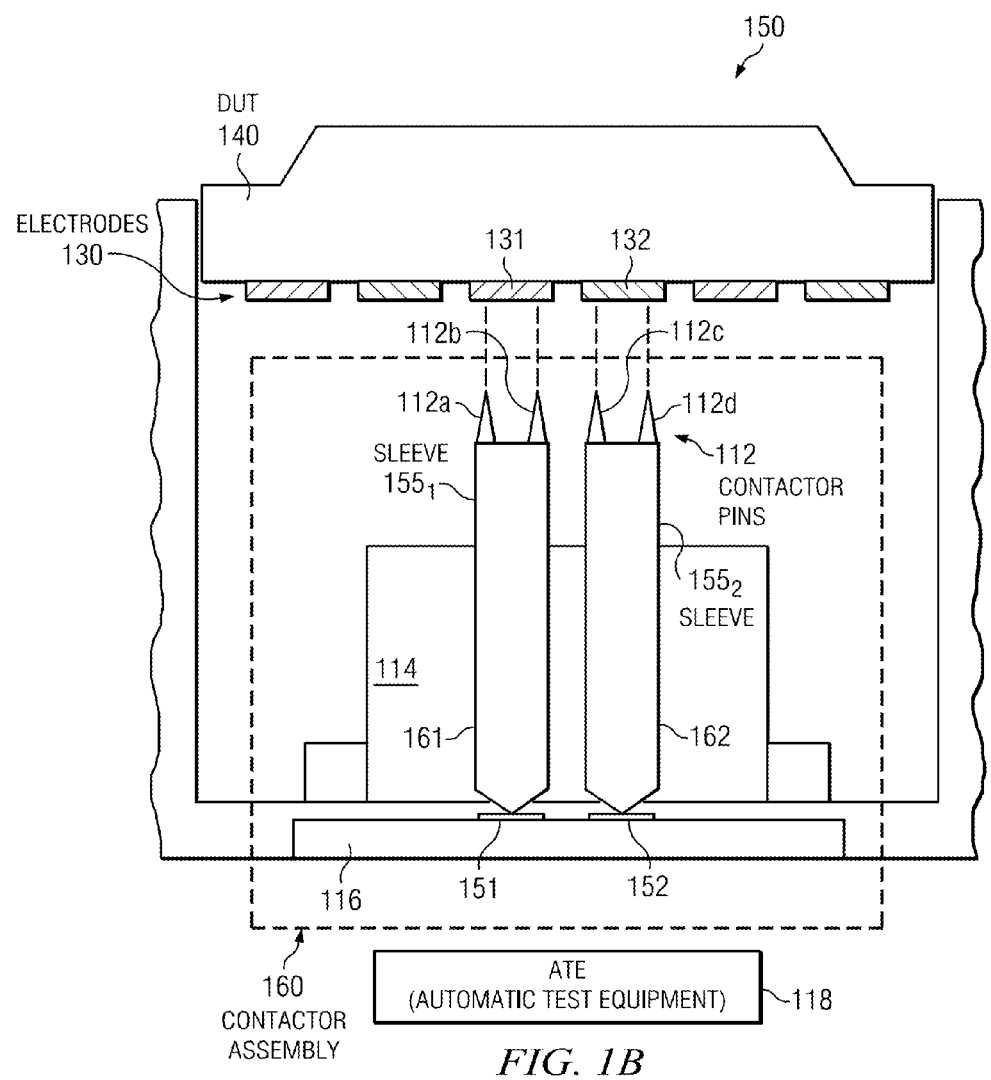
FIG. 1B represents an automatic tester including an example contactor assembly for automated testing of a DUT that includes a plurality of separate electrodes, according to another example embodiment.

FIG. 1B represents a depiction 150 of an automatic tester including an example contactor assembly 160 for automated testing of a DUT that includes a plurality of separate electrodes, according to another disclosed embodiment. In this embodiment, a plurality of sleeves shown as sleeves $155_1$ and $155_2$ are provided that are large enough to accommodate two contactor pins. The two contactor pins in each sleeve are shorted together within the sleeve. First contactor pin 112(a) and second contactor pin 112(b) within sleeve $155_1$ are coupled by path 161 which connects to pad 151 on the tester load board 116, while third contactor pin 112(c) and fourth contactor pin 112(d) within sleeve $155_2$ are coupled to path 162 which connects to pad 152 on the tester load board 116. Although not shown, each contactor pin 112(a)-(d) has its own spring.

Disclosed electrically in parallel arrangements that provide redundant paths to the electrodes is in contrast to known Kelvin contact arrangements which provides force and sense close loop feedback control but not redundant paths. Moreover, disclosed electrically in parallel arrangements that provides redundant paths to the electrodes is in contrast to known power supply arrangements that have multiple contactor pins each to different electrodes, such as to deliver high current levels to a DUT.

Disclosed embodiments include methods of automated testing DUTs that include a plurality of separate electrodes including a first electrode. A first location is contacted on the first electrode with a first contactor pin that provides a first path and another location on the first electrode is contacted with at least a second contactor pin that provides at least one redundant second path. The first path and second path are electrically tied together along a circuit path to ATE. The DUT is automatically tested using the ATE. The first contactor pin and second contactor pin are electrically in parallel to provide redundant paths to the first electrode so that either the first contactor pin or second contactor pin can provide an electrical contact to the first electrode.

Figure 2A:
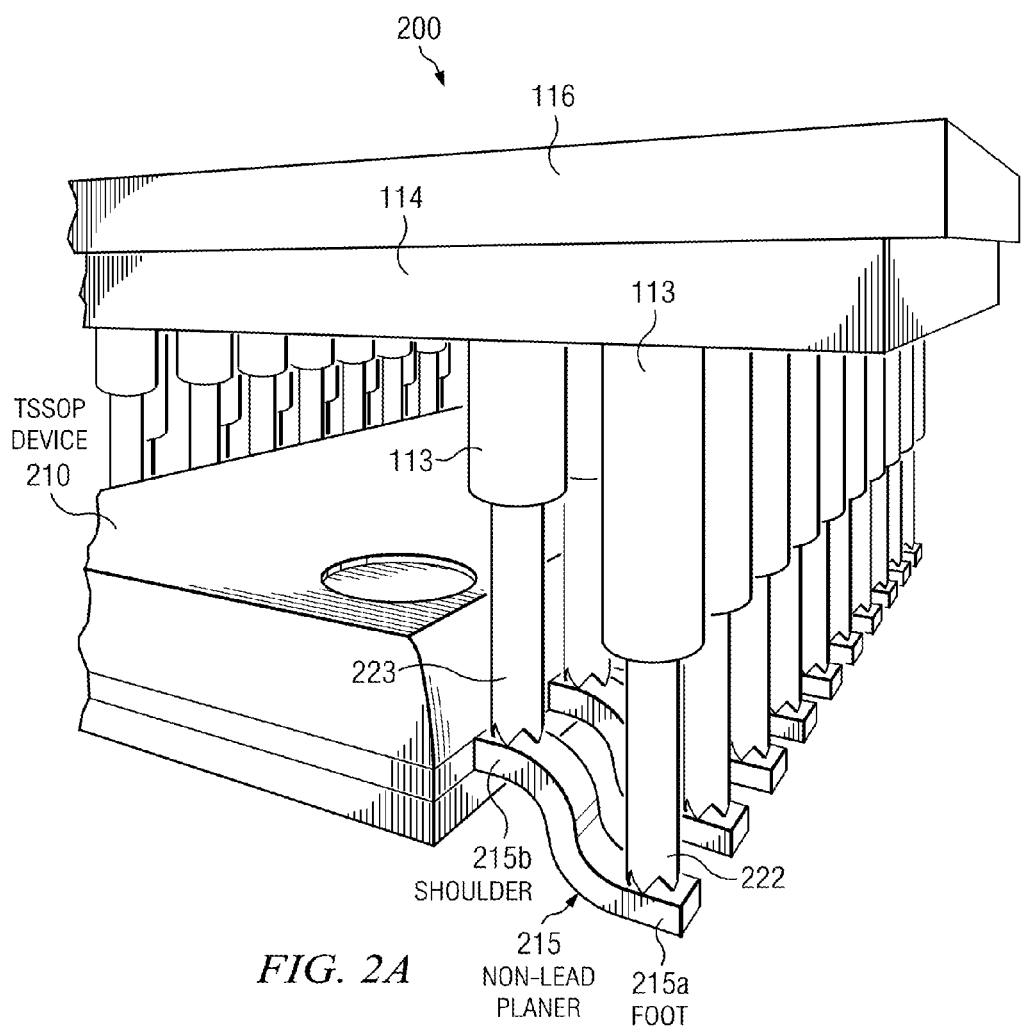
FIG. 2A is a depiction of a disclosed contactor assembly having dual contactor pins while testing a TSSOP device that has non-planar leads including a low elevation "foot" portion and a higher elevation "shoulder" portion, according to an example embodiment.

FIG. 2A is a depiction 200 of a disclosed contactor assembly having dual contactor pins that is based on the example contactor assembly 110 but adapted for non-planar leads being used to test a TSSOP device 210, according to an example embodiment. TSSOP device 210 has a plurality of electrodes shown as a plurality of non-planar leads 215 that each include a low elevation "foot" portion 215(a) and a higher elevation "shoulder" portion 215(b). The first contactor pin 222 and second contactor pin 223 are shown providing a non-planar contact to the same non-planar lead 215.

Figure 2B:
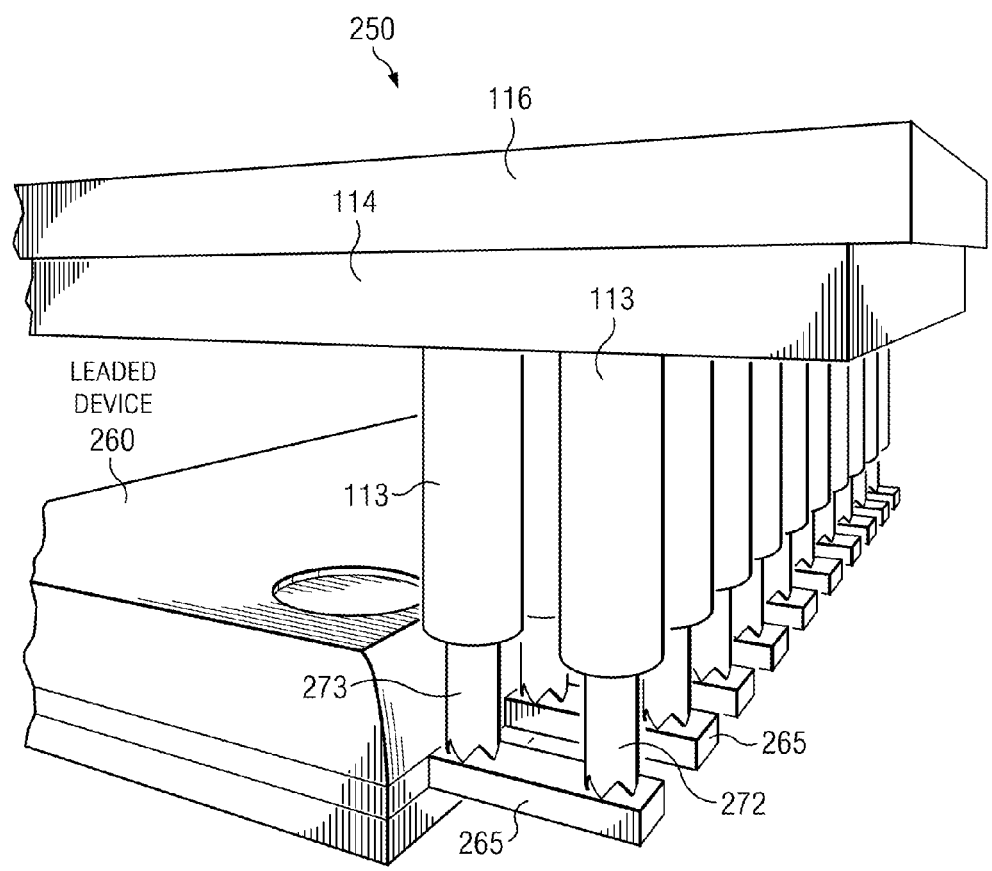
FIG. 2B is a depiction of a disclosed contactor assembly having dual contactor pins while testing a leaded device that has planar leads, according to an example embodiment.

FIG. 2B is a depiction 250 of a disclosed contactor assembly having dual contactor pins while testing a leaded device 260 that has planar leads, according to an example embodiment. The leaded device 260 has a plurality of electrodes shown as a plurality of planar leads 265. The first contactor pin 272 and second contactor pin 273 are shown providing a planar contact to the planar leads 265.

Disclosed contactor assemblies have been found to significantly reduce the occurrence of false opens. For example, a disclosed contactor assembly such as depicted in FIG. 2A was used to test TSSOP packaged devices. The TSSOP packages had non-planar leads 215 including a low elevation foot portion 215(a) and a higher elevation shoulder portion 215(b). Conventional testing for the same TSSOP devices 210 contacted only the foot portion 215(a) with a single contactor pin that was known to have a probability of a false open of 0.0036. It was found contacting the shoulder portion with a single contactor pin had a probability of a false open of 0.11. As described above, the contactor assembly depicted in FIG. 2A was adapted for non-planar leads to simultaneously contact the foot portion 215(a) with one contactor pin and contact the shoulder portion 215(b) portion with another contactor pin for each lead 215.

Since only one of the contacts made to the leads 215 of TSSOP device 210 as shown in FIG. 2A is needed for proper contact to allow accurate testing, laws of independent probability were used to calculate the probability of an open circuit using disclosed dual pin contactor assemblies. The probability of an open circuit for a disclosed dual pin contactor assembly is the product of the probability of the respective pin contacts taken individually (independently), which can be calculated as 0.0036*0.11=0.0004. Thus, in this example, the effect of using a dual pin contactor is a 10× reduction in probability of opens circuit, down to a level of 400 ppm. This reduction in the probability of open circuits was confirmed experimentally.

Disclosed embodiments can be used to test a variety of different IC devices and related products. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A contactor assembly for automated testing a device under test (DUT) that includes a plurality of separate electrodes including a first electrode, comprising:
   a tester load board;
   a contactor body coupled to said tester load board;
   a plurality of contactor pins carried by said contactor body comprising a first contactor pin and a second contactor pin that are electrically coupled to said tester load board, wherein said tester load board is configured to couple said plurality of contactor pins to automatic test equipment (ATE) for testing said DUT, wherein said first contactor pin and said second contactor pin are positioned to both contact said first electrode, and wherein a first path to said first contactor pin and a second path to said second contactor pin are electrically shorted together by said contactor assembly to be electrically in parallel to provide redundant paths to said first electrode during said automated testing of said DUT; and
   a plurality of sleeves attached to said contactor body, and wherein said first contactor in and said second contactor pin are within and shorted together by one of said plurality of sleeves.

2. The contactor assembly of claim 1, wherein said tester load board includes a plurality of pads including a first pad coupled to said first contactor pin and a second pad coupled to said second contactor pin.

3. The contactor assembly of claim 1, wherein said first contactor pin and said second contactor pin provide a planar contact to said first electrode.

4. The contactor assembly of claim 1, wherein said first contactor pin and said second contactor pin provide a non-planar contact to said first electrode.

5. A method of automated testing a device under test (DUT) that includes a plurality of separate electrodes including a first electrode, comprising:
   contacting a first location on said first electrode with a first contactor pin that provides a first path and another location on said first electrode with at least a second contactor pin that provides at least one redundant second path, wherein said first path and said second path are electrically tied together along a circuit path to automatic test equipment (ATE); and
   automatically testing said DUT using said ATE, wherein said first contactor pin and said second contactor pin are electrically in parallel to provide redundant paths to said first electrode so that either said first contactor pin or said second contactor pin can provide an electrical contact to said first electrode, wherein said contactor pins are carried by a contactor body includes a plurality of sleeves attached to said contactor body, wherein said first contactor pin and said second contactor pin are within and shorted together by one of said plurality of sleeves.

6. The method of claim 5, wherein said plurality of separate electrodes of said DUT comprise a plurality of leads including a first lead, wherein said first lead is a non-planar lead, and wherein said first location is a low elevation portion of said first lead and said another location is a high elevation portion of said first lead.

* * * * *